US007262130B1

(12) United States Patent
Ahn et al.

(10) Patent No.: US 7,262,130 B1
(45) Date of Patent: Aug. 28, 2007

(54) METHODS FOR MAKING INTEGRATED-CIRCUIT WIRING FROM COPPER, SILVER, GOLD, AND OTHER METALS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/484,303

(22) Filed: Jan. 18, 2000

(51) Int. Cl.
*H01L 21/4763* (2006.01)

(52) U.S. Cl. .............................. 438/643; 257/E21.584
(58) Field of Classification Search ................ 438/52, 438/653, 643, 686, 627, 650; 257/E21.584
See application file for complete search history.

(56) References Cited

U.S. PATENT DOCUMENTS

| | | | |
|---|---|---|---|
| 2,842,438 A | 7/1958 | Saarivirta et al. .............. 75/153 |
| 3,954,570 A | 5/1976 | Shirk et al. ..................... 201/15 |
| 4,213,818 A | 7/1980 | Lemons et al. .............. 438/719 |
| 4,386,116 A | 5/1983 | Nair et al. ...................... 427/99 |
| 4,394,223 A | 7/1983 | Hall ............................. 204/15 |
| 4,423,547 A | 1/1984 | Farrar et al. ................... 29/571 |
| 4,565,157 A | 1/1986 | Brors et al. .................. 118/719 |
| 4,574,095 A | 3/1986 | Baum et al. ................ 427/53.1 |
| 4,762,728 A | 8/1988 | Keyser et al. ................. 427/38 |
| 4,788,082 A | 11/1988 | Schmitt .................... 427/248.1 |
| 4,824,544 A | 4/1989 | Mikalesen et al. |

(Continued)

FOREIGN PATENT DOCUMENTS

EP 0304046 2/1989

(Continued)

OTHER PUBLICATIONS

Eisenbraun, E..T. , et al. ,"Selective and Blanket Low-Temperature Copper CVD for Multilevel Metallization in ULSI", *Conference Proceedings ULSI-VII*, (1992),5 pages.

(Continued)

*Primary Examiner*—William David Coleman
(74) *Attorney, Agent, or Firm*—Schwegman, Lundberg, Woessner & Kluth, P.A.

(57) ABSTRACT

Integrated circuits, the key components in thousands of electronic and computer products, include interconnected networks of electrical components. The components are typically wired, or interconnected, together with aluminum wires. In recent years, researchers have begun using copper instead of aluminum to form integrated-circuit wiring, because copper offers lower electrical resistance and better reliability at smaller dimensions. However, copper typically requires use of a diffusion barrier to prevent it from contaminating other parts of an integrated circuit. Unfortunately, typical diffusion barrier materials add appreciable resistance to the copper wiring, and thus negate some advantages of using copper. Moreover, conventional methods of forming the copper wiring are costly and time consuming. Accordingly, the inventors devised one or more exemplary methods for making integrated-circuit wiring from materials, such as copper-, silver-, and gold-based metals. One exemplary method removes two or more masks in a single removal procedure, forms a low-resistance diffusion barrier on two or more wiring levels in a single formation procedure, and fills insulative material around and between two or more wiring levels in a single fill procedure. This and other embodiments hold the promise of simplifying fabrication of integrated-circuit wiring dramatically.

11 Claims, 4 Drawing Sheets

U.S. PATENT DOCUMENTS

| | | | |
|---|---|---|---|
| 4,847,111 A | 7/1989 | Chow et al. ............... 427/38 |
| 4,931,410 A | 6/1990 | Tokunaga et al. ........... 437/189 |
| 4,933,743 A | 6/1990 | Thomas et al. |
| 4,948,459 A | 8/1990 | Van Laarhoven et al. .. 156/643 |
| 4,962,058 A | 10/1990 | Cronin et al. .............. 437/187 |
| 4,996,584 A | 2/1991 | Young et al. ................. 357/71 |
| 5,000,818 A | 3/1991 | Thomas et al. |
| 5,019,531 A | 5/1991 | Awaya et al. ............... 437/180 |
| 5,034,799 A | 7/1991 | Tomita et al. ................ 357/71 |
| 5,071,518 A | 12/1991 | Pan |
| 5,084,412 A | 1/1992 | Nakasaki .................... 437/189 |
| 5,100,499 A | 3/1992 | Douglas .................... 156/635 |
| 5,130,274 A | 7/1992 | Harper et al. ............... 437/195 |
| 5,158,986 A | 10/1992 | Cha et al. .................... 521/82 |
| 5,171,713 A | 12/1992 | Matthews |
| 5,173,442 A | 12/1992 | Carey ......................... 437/173 |
| 5,231,056 A | 7/1993 | Sandhu ...................... 437/200 |
| 5,240,878 A | 8/1993 | Fitzsimmons et al. ...... 437/187 |
| 5,243,222 A | 9/1993 | Harper et al. ............... 257/774 |
| 5,256,205 A | 10/1993 | Schmitt, III et al. ........ 118/723 |
| 5,334,356 A | 8/1994 | Baldwin et al. ............ 422/133 |
| 5,348,811 A | 9/1994 | Nagao et al. |
| 5,354,712 A | 10/1994 | Ho et al. .................... 437/195 |
| 5,371,042 A | 12/1994 | Ong ............................ 437/194 |
| 5,374,849 A | 12/1994 | Tada |
| 5,384,284 A | 1/1995 | Doan et al. ................. 437/190 |
| 5,401,680 A * | 3/1995 | Abt et al. ....................... 438/3 |
| 5,413,687 A | 5/1995 | Barton et al. .......... 204/192.14 |
| 5,413,962 A | 5/1995 | Lur et al. .................... 437/195 |
| 5,426,330 A | 6/1995 | Joshi et al. .................. 257/752 |
| 5,442,237 A | 8/1995 | Hughes et al. .............. 257/759 |
| 5,447,887 A | 9/1995 | Filipiak et al. ............. 437/200 |
| 5,451,804 A | 9/1995 | Lur et al. |
| 5,470,789 A | 11/1995 | Misawa ...................... 437/190 |
| 5,470,801 A | 11/1995 | Kapoor et al. .............. 437/238 |
| 5,495,667 A | 3/1996 | Farnworth et al. ............ 29/843 |
| 5,506,449 A | 4/1996 | Nakano et al. .............. 257/758 |
| 5,538,922 A | 7/1996 | Cooper et al. .............. 437/195 |
| 5,539,060 A | 7/1996 | Tsunogae et al. ........... 525/338 |
| 5,595,937 A | 1/1997 | Mikagi ....................... 437/192 |
| 5,609,721 A | 3/1997 | Tsukune et al. .......... 156/646.1 |
| 5,625,233 A | 4/1997 | Cabral, Jr. et al. |
| 5,633,200 A * | 5/1997 | Hu ............................... 438/653 |
| 5,635,253 A | 6/1997 | Canaperi et al. ............ 427/437 |
| 5,654,245 A | 8/1997 | Allen .......................... 438/629 |
| 5,670,420 A | 9/1997 | Choi .......................... 437/189 |
| 5,674,787 A | 10/1997 | Zhao et al. .................. 437/230 |
| 5,679,608 A | 10/1997 | Cheung et al. .............. 437/195 |
| 5,681,441 A | 10/1997 | Svendsen et al. ........... 205/114 |
| 5,693,563 A | 12/1997 | Teong |
| 5,695,810 A | 12/1997 | Dubin et al. .................. 427/96 |
| 5,719,089 A | 2/1998 | Cherng et al. .............. 438/637 |
| 5,719,410 A | 2/1998 | Suehiro et al. ................ 257/77 |
| 5,719,447 A * | 2/1998 | Gardner ...................... 257/762 |
| 5,739,579 A | 4/1998 | Chiang et al. .............. 257/635 |
| 5,763,953 A | 6/1998 | Iijima et al. ................. 257/762 |
| 5,780,358 A | 7/1998 | Zhou et al. .................. 438/645 |
| 5,785,570 A | 7/1998 | Bruni ........................... 445/52 |
| 5,789,264 A * | 8/1998 | Chung .......................... 438/52 |
| 5,792,522 A | 8/1998 | Jin et al. ...................... 427/575 |
| 5,801,098 A | 9/1998 | Fiordalice et al. .......... 438/653 |
| 5,814,557 A | 9/1998 | Venkatraman et al. ...... 438/622 |
| 5,821,168 A | 10/1998 | Jain ............................ 438/692 |
| 5,824,599 A | 10/1998 | Schacham-Diamand et al. ........... 438/678 |
| 5,840,625 A | 11/1998 | Feldner |
| 5,858,877 A | 1/1999 | Dennison et al. ........... 438/700 |
| 5,889,295 A | 3/1999 | Rennie et al. |
| 5,891,797 A | 4/1999 | Farrar ......................... 438/619 |
| 5,891,804 A | 4/1999 | Havemann et al. ......... 438/674 |
| 5,895,740 A | 4/1999 | Chien et al. ................. 430/313 |
| 5,897,370 A | 4/1999 | Joshi et al. .................. 438/632 |
| 5,899,740 A | 5/1999 | Kwon |
| 5,907,772 A | 5/1999 | Iwasaki ....................... 438/253 |
| 5,911,113 A | 6/1999 | Yao et al. .................... 438/649 |
| 5,925,930 A | 7/1999 | Farnworth et al. .......... 257/737 |
| 5,930,669 A | 7/1999 | Uzoh .......................... 438/627 |
| 5,932,928 A | 8/1999 | Clampitt ..................... 257/758 |
| 5,939,771 A | 8/1999 | Usami et al. |
| 5,940,733 A * | 8/1999 | Beinglass et al. ........... 438/655 |
| 5,948,467 A | 9/1999 | Nguyen et al. ............... 427/99 |
| 5,962,923 A | 10/1999 | Xu et al. ..................... 257/774 |
| 5,968,327 A | 10/1999 | Kobayashi et al. |
| 5,969,398 A | 10/1999 | Murakami |
| 5,972,179 A | 10/1999 | Chittipeddi et al. ... 204/192.17 |
| 5,972,804 A | 10/1999 | Tobin et al. ................. 438/786 |
| 5,976,710 A | 11/1999 | Sachdev et al. ............ 428/620 |
| 5,981,350 A | 11/1999 | Geusic et al. ............... 438/386 |
| 5,985,759 A | 11/1999 | Kim et al. ................... 438/653 |
| 5,989,623 A | 11/1999 | Chen et al. .................... 427/97 |
| 5,994,777 A | 11/1999 | Farrar ......................... 257/758 |
| 6,002,175 A | 12/1999 | Maekawa |
| 6,004,884 A * | 12/1999 | Abraham .................... 438/714 |
| 6,008,117 A | 12/1999 | Hong et al. ................. 438/629 |
| 6,015,465 A | 1/2000 | Kholodenko et al. ....... 118/719 |
| 6,017,820 A | 1/2000 | Ting et al. ................... 438/689 |
| 6,022,802 A | 2/2000 | Jang |
| 6,028,362 A | 2/2000 | Omura |
| 6,030,877 A | 2/2000 | Lee et al. .................... 438/381 |
| 6,030,895 A * | 2/2000 | Joshi et al. .................. 438/679 |
| 6,037,248 A | 3/2000 | Ahn ............................ 438/619 |
| 6,065,424 A | 5/2000 | Shacham-Diamand et al. ........... 118/696 |
| 6,069,068 A | 5/2000 | Rathore et al. ............. 438/628 |
| 6,071,810 A | 6/2000 | Wada et al. ................. 438/635 |
| 6,091,136 A | 7/2000 | Jiang et al. .................. 257/676 |
| 6,100,193 A | 8/2000 | Suehiro et al. .............. 438/685 |
| 6,126,989 A | 10/2000 | Robinson et al. ............. 427/97 |
| 6,136,095 A | 10/2000 | Xu et al. ..................... 118/719 |
| 6,139,699 A | 10/2000 | Chiang et al. .......... 204/192.15 |
| 6,140,228 A | 10/2000 | Shan et al. .................. 438/653 |
| 6,140,234 A | 10/2000 | Uzoh et al. .................. 438/678 |
| 6,143,641 A | 11/2000 | Kitch |
| 6,143,646 A | 11/2000 | Wetzel ........................ 438/637 |
| 6,143,655 A * | 11/2000 | Forbes et al. ............... 438/686 |
| 6,143,671 A * | 11/2000 | Sugai .......................... 438/783 |
| 6,150,214 A | 11/2000 | Kaeriyama |
| 6,150,261 A | 11/2000 | Hsu et al. .................... 438/640 |
| 6,153,507 A | 11/2000 | Mikagi ....................... 438/618 |
| 6,159,769 A | 12/2000 | Farnworth et al. .......... 438/108 |
| 6,162,583 A | 12/2000 | Yang et al. |
| 6,169,024 B1 | 1/2001 | Hussein |
| 6,171,661 B1 | 1/2001 | Zheng et al. ................ 427/535 |
| 6,174,804 B1 | 1/2001 | Hsu |
| 6,177,350 B1 | 1/2001 | Sundarrajan et al. ....... 438/688 |
| 6,181,012 B1 | 1/2001 | Edelstein et al. |
| 6,183,564 B1 | 2/2001 | Reynolds et al. ........... 118/719 |
| 6,187,656 B1 | 2/2001 | Lu et al. ..................... 438/592 |
| 6,190,732 B1 | 2/2001 | Omstead et al. ............ 118/729 |
| 6,197,181 B1 | 3/2001 | Chen .......................... 205/123 |
| 6,197,688 B1 | 3/2001 | Simpson ..................... 438/678 |
| 6,207,222 B1 | 3/2001 | Chen et al. .................... 427/97 |
| 6,207,553 B1 | 3/2001 | Buynoski et al. ........... 438/622 |
| 6,207,558 B1 | 3/2001 | Singhvi et al. ............. 438/648 |
| 6,208,016 B1 | 3/2001 | Farrar ......................... 257/643 |
| 6,211,049 B1 | 4/2001 | Farrar ......................... 438/597 |
| 6,211,073 B1 | 4/2001 | Ahn et al. .................... 438/653 |
| 6,215,186 B1 | 4/2001 | Konecni et al. |
| 6,221,763 B1 | 4/2001 | Gilton ......................... 438/643 |
| 6,232,219 B1 | 5/2001 | Blalock et al. .............. 438/637 |
| 6,249,056 B1 | 6/2001 | Kwon et al. ................. 257/758 |
| 6,251,781 B1 | 6/2001 | Zhou et al. |
| 6,258,707 B1 | 7/2001 | Uzoh |
| 6,265,311 B1 | 7/2001 | Hautala et al. .............. 438/680 |

| | | | |
|---|---|---|---|
| 6,271,592 B1 | 8/2001 | Kim et al. ................. 257/751 |
| 6,284,656 B1 | 9/2001 | Farrar ........................ 438/687 |
| 6,287,954 B1 | 9/2001 | Ashley et al. .............. 438/622 |
| 6,288,442 B1 | 9/2001 | Farrar ........................ 257/678 |
| 6,288,447 B1 | 9/2001 | Amishiro et al. |
| 6,303,498 B1 | 10/2001 | Chen et al. |
| 6,323,543 B1 | 11/2001 | Jiang et al. ................. 257/676 |
| 6,323,553 B1 | 11/2001 | Hsu et al. ................... 257/751 |
| 6,326,303 B1 | 12/2001 | Robinson et al. .......... 438/678 |
| 6,333,255 B1 | 12/2001 | Sekiguchi |
| 6,342,448 B1 | 1/2002 | Lin et al. .................... 438/687 |
| 6,358,842 B1 | 3/2002 | Zhou et al. ................. 438/633 |
| 6,359,328 B1 | 3/2002 | Dubin ........................ 257/622 |
| 6,361,667 B1 | 3/2002 | Kobayashi et al. |
| 6,365,511 B1 | 4/2002 | Kizilyalli et al. |
| 6,372,622 B1 | 4/2002 | Tan et al. ................... 438/612 |
| 6,376,370 B1 | 4/2002 | Farrar ........................ 438/678 |
| 6,383,920 B1 | 5/2002 | Wang et al. ................ 438/639 |
| 6,387,542 B1 | 5/2002 | Kozlov et al. .............. 428/673 |
| 6,399,489 B1 | 6/2002 | M'Saad et al. ............. 438/680 |
| 6,403,481 B1 | 6/2002 | Matsuda et al. ............ 438/687 |
| 6,417,094 B1 | 7/2002 | Zhao et al. |
| 6,429,120 B1 | 8/2002 | Ahn et al. ................... 438/635 |
| 6,492,266 B1 * | 12/2002 | Ngo et al. ................... 438/687 |
| 6,518,198 B1 | 2/2003 | Klein ......................... 438/758 |
| 6,589,863 B1 | 7/2003 | Usami |
| 6,614,099 B2 * | 9/2003 | Farrar ........................ 257/643 |
| 6,984,891 B2 | 1/2006 | Ahn et al. |
| 7,067,421 B2 | 6/2006 | Ahn et al. |
| 7,105,914 B2 | 9/2006 | Farrar |
| 2001/0002333 A1 | 5/2001 | Huang et al. ............... 438/637 |
| 2002/0014646 A1 | 2/2002 | Tsu et al. ................... 257/296 |
| 2002/0028552 A1 | 3/2002 | Lee et al. ................... 438/243 |
| 2002/0096768 A1 | 7/2002 | Joshi .......................... 257/750 |
| 2002/0109233 A1 | 8/2002 | Farrar ........................ 257/762 |
| 2002/0167089 A1 | 11/2002 | Ahn et al. |
| 2003/0034560 A1 | 2/2003 | Matsuse et al. |
| 2005/0023697 A1 | 2/2005 | Ahn, et al. |
| 2005/0023699 A1 | 2/2005 | Ahn, et al. |

FOREIGN PATENT DOCUMENTS

| | | |
|---|---|---|
| JP | 5-267643 | 10/1993 |
| JP | 7078815 | 3/1995 |
| JP | 07078815 | 3/1995 |
| JP | 07-321111 | 8/1995 |

OTHER PUBLICATIONS

Kaloyeros, A..E. , et al. ,"Blanket and Selective Copper CVD from Cu(FOD)2 for Multilivel Metallization", *Mat. Res. Soc. Symp. Proc.*, vol. 181,(1990),6 pages.

Klaus, J..W. ,"Atomic Layer Deposition of Tungsten Nitride Films Using Sequential Surface Reactions", *Journal of the Electrochemical Society*, 147(3),(2000),pp. 1175-1181.

Min, Jae-Sik.,"Metal-Organic Atomic-Layer Deposition of Titanium-Silicon-Nitride Films", *Applied Physics Letters*, vol. 75, No. 11,(1999),pp. 1521-1523.

*In: Kirk-Othmer Concise Encyclopedia of Chemical Technology,* Grayson, M., (ed.), John Wiley & Sons, Inc., New York, NY, p. 433-435, 926-938, (1985).

*In: Metals Handbook, Ninth Edition,* vol. 2, Properties and Selection: Nonferrous Alloys and Pure Metals, ASM Handbook Committee, (eds.), American Society for Metals, Metals Park, OH, 157, 395, (1989).

"Brooks Model 5964 High Performance Metal Seal Mass Flow Controller (Introduced in 1991)", *Brooks Instrument,* http://www.frco.com/brooks/semiconductor/producsli.html, 1 page, (1991).

Abe, K., et al., "Sub-half Micron Copper Interconnects Using Reflow of Sputtered Copper Films", *VLSI Multilevel Interconnection Conference,* 308-311, (Jun. 25-27, 1995).

Andricacos, P.C., "Copper On-Chip Interconnections", *The Electrochemical Society Interface,* pp. 32-37, (1999).

Anonymous, "Formation of Conductors at Variable Depths—Using Differential Photomask, Projecting Images into Insulator by Reactive Ion Etching, Selectively Filling Images with Conductor", *Research Disclosure,* Disclosure No. RD 291015, Abstract, 1 p., (Jul. 10, 1988).

Anonymous, "Improved Metallurgy for Wiring Very Large Scale Integrated Circuits", *International Technology Disclosures,* 4, Abstract, 1 page, (1986).

Bae, S., et al., "Low-Temperature Deposition Pathways to Silicon Nitride, Amorphous Silicon, Polycrystalline Silicon, and n type Amorphous Silicon Films Using a High Density Plasma System", *IEEE Conference Records---Abstracts, International Conference on Plasma Science,* p. 315, (1997).

Bai, G., et al., "Copper Interconnection Deposition Techniques and Integration", *1996 Symposium on VLSI Technology,* Digest of Technical Papers, 48-49, (1996).

Bernier, M., et al., "Laser processing of palladium for selective electroless copper plating", *SPIE, 2045*, pp. 330-337, (1994).

Bhansali, S., et al., "A novel technique for fabrication of metallic structures on polymide by selective electroless copper plating using ion implantation", *Thin Solid Films, 270,* pp. 489-492, (1995).

Bhansali, S., et al., "Selective electroless copper plating on silicon seeded by copper ion implantation", *Thin Solid Films, 253,* pp. 391-394, (1994).

Braud, E., et al., "Ultra Thin Diffusion Barriers for Cu Interconnections at The Gigabit Generation and Beyond", *VMIC Conference Proceedings,* pp. 174-179, (1996).

Cabrera, A.L., et al., "Oxidation protection for a variety of transition metals and copper via surface silicides formed with silane containing atmospheres", *J. Mater. Res., 6(1),* pp. 71-79, (1991).

Craig, J.D., "Polymide Coatings", *In: Packaging, Electronic Materials Handbook,* vol. 1, ASM International Handbook Committee (eds.), ASM International, Materials Park, OH, 767-772, (1989).

de Felipe, T.S., et al., "Electrical Stability and Microstructural Evolution in Thin Films of High Conductivity Copper Alloys", *IEEE,* pp. 293-295, (1999).

Ding, et al., "Copper Barrier, Seed Layer and Planerization Technologies", *VMIC Conference Proceedings,* pp.87-92 (1997).

Dubin, V.M., et al., "Selective and Blanket Electroless Copper Deposition for Ultralarge Scale Integration", *J. Electrochem. Soc., 144(3),* pp. 898-908, (1997).

Dushman, S., et al., *Scientific Foundations of Vacuum Technique,* 2nd Edition, John Wiley and Sons, 1-806, (1962).

Edelstein, D., et al., "Full Copper Wiring in a Sub-0.25 micrometer CMOS ULSI Technology", *IEDM,* pp. 773-776, (1997).

Eldridge, J.M., "New Approaches for Investigating Corrosion in Thin Film Devices", *Electronic Packaging and Corrosion in Microelectronics, PRoceedings of ASM'Third Conference on Electric Packaging: Materials and Processes & Corrosion in Microelectronics,* Mpls, MN, pp. 283-285, (1987).

Ernst, et al., "Growth Model for Metal Films on Oxide Surface: Cu on ZnO(0001)-O", *Physical Review B, 47,* 13782-13796, (May 15, 1993).

Gladlfelter, W.L., et al., "Trimethylamine Complexes of Alane as Precursors for the Low-Pressure Chemical Vapor Deposition of Aluminum", *Chemistry of Materials, 1,* pp. 339-343, (1989).

Godbey, D.J., et al., "Copper Diffusion in Organic Polymer Resists and Inter-level Dielectrics", *Thin Solid Films, 308-309,* pp. 470-474, (1997).

Grimblot, J., et al., "II. Oxidation of Al Films", *J. Electrochem., 129,* pp. 2369-2372, (1982).

Hattangady, S.V., et al., "Integrated processing of silicon oxynitride films by combined plasma and rapid-thermal processing", *J. Vac. Sci. Technol. A, 14(6),* pp. 3017-3023, (1996).

Hirao, S., et al., "A Novel Copper Reflow Process Using Dual Wetting Layers", *1997 Symposium on VLSI Technology,* Digest of Technical Papers, 57-58, (1997).

Hirata, A., et al., "WSiN Diffusion Barrier Formed by ECR Plasma Nitridation for Copper Damascene Interconnection", *16th Solid State Devices and Materials,* pp. 260-261, (1998).

Holloway, K., et al., "Tantalum as a diffusion barrier between copper and silicon", *Appl. Phys. Lett., 57 (17),* pp. 1736-1738, (Oct. 1990).

Hu, C.K., et al., "Extendibility of Cu Damascene to 0.1 micrometer Wide Interconnections", *Mat. Res. Soc. Symp. Proc. 514*, pp. 287-292, (1998).

Hymes, S., et al., "Passivation of Copper by Silicide Formation in Dilute Silane", *Conference Proceedings ULSI-VII*, pp. 425-431, (1992).

Iijima, T., et al., "Microstructure and Electrical Properties of Amorphous W-Si-N Barrier Layer for Cu Interconnections", *1996 VMIC Conference*, pp. 168-173, (1996).

Izaki, M., et al., "Characterization of Transparent Zinc Oxide Films Prepared by Electrochemical Reaction", *Journal of the Electrochemical Society, 144*, 1949-1952, (Jun. 1997).

Jayaraj, K., et al., "Low Dielectric Constant Microcellular Foams", *Proceedings from the Seventh Meeting of the DuPont Symposium on Polymides in Microelectrics*, pp. 474-501, (Sep. 1996).

Jeon, Y., et al., "Low-Temperature Fabrication of Polycrystalline Silicon Thin Films by ECR Pecvd", *The Electrochemical Society Proceedings, 94(35)*, pp. 103-114; (1995).

Jin, C., et al., "Porous Xerogel Films as Ultra-low Permittivity Dielectrics for ULSI Interconnect Applications", *Conference Proceedings ULSI XII—1997 Materials Research Society*, pp. 463-469, (1997).

Kamins, T.I., "Structure and Properties of LPCVD Silicon Films", *J. Electrochem. Soc. : Solid-State Science and Technology, 127*, pp. 686-690, (Mar. 1980).

Kang, H.K., et al., "Grain Structure and Electromigration Properties of CVD CU Metallization", *Proceedings of the 10th International VLSI Multilevel Interconnection Conference*, 223-229, (Jun. 8-9, 1993).

Keppner, H., et al., "The "Micromorph" Cell : A New Way to High-Efficiency-Low-Temperature Crystalline Silicon Thin-Film Cell Manufacturing", *Mat. Res. Soc. Symp. Proc., 452*, pp. 865-876, (1997).

Kiang, M., et al., "Pd/Si plasma immersion ion implantation for selective electrless copper plating on Sio2", *Appl. Phys. Lett., 60*, pp. 2767-2769, (1992).

Kistiakowsky, G.B., et al., "Reactions of Nitrogen Atoms. I. Oxygen and Oxides of Nitrogen", *The Journal of Chemical Physics, 27(5)*, pp. 1141-1149, (1957).

Laursen, T., et al., "Encapsulation of Copper by Nitridation of Cu-Ti Alloy/Bilayer Structures", *International Conference on Metallurgical Coatings and Thin Films*, Abstract No. H1.03, San Diego, CA, p. 309, (Apr. 1997).

Len, V., et al., "An investigation into the performance of diffusion barrier materials against copper diffusion using metal-oxide-semiconductor (MOS) capacitor structures", *Solid-State Electronics, 43*, pp. 1045-1049, (1999).

Lyman, T., et al., "Metallography, Structures and Phase Diagrams", *Metals Handbook, 8*, American Society for Metals, Metals Park, Ohio, pp. 300 & 302, (1989).

Marcadal, C., et al., "OMCVD Copper Process for Dual Damascene Metallization", *VMIC Conference*, ISMIC, pp. 93-97, (1997).

Miller, R.D., et al., "Low Dielectric Constant Polyimides and Polyimide Nanofoams", *Seventh Meeting of the DuPont Symposium on Polymides in Microelectronics*, pp. 443-473, (Sep. 1996).

Miyake, T., et al., "Atomic Hydrogen Enhanced Reflow of Copper", *Applied Physics Letters, 70*, 1239-1241, (1997).

Murarka, S.P., et al., "Copper Interconnection Schemes: Elimination of The Need of Diffusion Barrier/Adhesion Promoter by the Use of Corrosion Resistant, Low Resistivity Doped Copper", *SPIE, 2335*, pp. 80-90, (1994).

Nakao, S., et al., "Thin and Low-Resistivity Tantalum Nitride Diffusion Barrier and Giant-Grain Copper Interconnects for Advanced ULSI Metallization", *Japanese Journal of Applied Physics, 38(4B)*, pp. 262-263, (Apr. 1999).

Newboe, B., et al., "Applied Materials Announces First Barrier/Seed Layer System For Copper Interconnects", *Applied Materials*, http://www.appliedmaterials.com/newsroom/pr-00103.html, pp. 1-4, (1997).

Okamoto, Y., et al., "Magnetically Excited PLasma Oxynitridation of Si at Room Temperature", *Jpn. J. Appl. Phys., 34*, pp. L955-957, (1995).

Palleau, J., et al., "Refractory Metal Encapsulation in Copper Wiring", *Advanced Metallization for Devices and Circuits-Science, Technology and Manufacturability, Materials Research Society Symposium Proceedings, 337*, pp. 225-231, (Apr. 1994).

Park, C.W., et al., "Activation Energy for Electromigration in Cu Films", *Applied Physics Letters, 59 (*, 175-177, (Jul. 6, 1991).

Radzimski, Z.J., et al., "Directional Copper Deposition using d-c Magnetron Self-sputtering", *J. Vac. Sci. Technol. B, 16(3)*, pp. 1102-1106, (1998).

Ramos, T., et al., "Nanoporous Silica for Dielectric Constant Less Than 2", *Conference Proceedings ULSI XII—1997 Materials and Solar Cells, 48*, pp. 269-277, (1997).

Rath, J.K., et al., "Low-Temperature deposition of polycrystalline silicon thin films by hot-wire CVD", *Solar Energy Materials and Solar Cells, 48*, pp. 269-277, (1997).

Ray, S.K., et al., "Flourine-enhanced nitridation of silicon at low temperatures in a microwave plasma", *J. Appl. Phys., 70(3)*, pp. 1874-1876, (1991).

Rossnagel, S.M., "Magnetron Sputter Deposition of Interconnect Applications", *Conference Proceedings, ULSI XI*, 227-232, (1996).

Rossnagel, S.M., et al., "Metal ion deposition from ionized mangetron sputtering discharge", *J. Vac. Sci. Technol. B, 12(1)*, pp. 449-453, (1994).

Ryan, J.G., et al., "Copper Interconnects for Advanced Logic and DRAM", Extended Abstracts of the 1998 International Conference on Solid-State Devices and Materials, Hiroshima, pp. 258-259, (1998).

Ryu, C., et al., "Barriers for copper interconnections", *Solid State Technology*, pp. 53,54,56, (Apr. 1999).

Saarivirta, M.J., "High Conductivity Copper Rich Cu-Zr Alloys", *Transactions of the Metallurgical Society of AIME, 218*, pp. 431-437, (1960).

Senzaki, Y., "Chemical Vapor Deposition of Copper using a New Liquid Precursor with Improved Thermal Stability", *Conference Proceedings ULSI XIII, Materials Research Society*, pp. 451-455, (1998).

Shacham-Diamand, Y., "100 nm Wide Copper Lines Made by Selective Electroless Deposition", *Journal of Micromechanics and Microengineering, 1*, 66-72, (Mar. 1991).

Shacham-Diamond, Y., et al., "Copper electroless deposition technology for ultra-large-scale-integration (ULSI) metallization", *Microelectronic Engineering, 33*, pp. 47-58, (1997).

Srivatsa, A.R., et al., "Jet Vapor Deposition: an Alternative to Electrodeposition", *Surface Engineering, 11*, 75-77, (1995).

Tao, J., et al., "Electromigration Characteristics of Copper Interconnects", *IEEE Electron Devices Letters, 14*, 249-251, (May 1993).

Ting, C.H., "Methods and Needs for Low K Material Research", *Materials Research Society Symposium Proceedings*, vol. 381, Low-Dielectric Constant Materials— Synthesis and Applications in Microelectronics, Lu, T.M., et al., (eds.), San Francisco, CA, 3-17, (Apr. 17-19, 1995).

Tsukada, T., et al., "Adhesion of copper films on ABS polymers deposited in an internal magnet magnetron sputtering system", *J. Vac. Technol., 16(2)*, pp. 348-351, (1979).

Van Vlack, L.H., *Elements of Materials Science*, Addison-Wesley Publishing Co., Inc. Reading, MA, p. 468, (1959).

Venkatesan, S., et al., "A High Performance 1.8V, 0.20 micrometer CMOS Technology with Copper Metalization", *IEEE*, pp. 769-772, (1997).

Vossen, J.L., et al., *Thin Film Processes II*, Academic Press, Inc., 1-866, (1991).

Wang, K., et al., "Very Low Temperature Deposition of Polycrystalline Silicon Films with Micro-Meter-Order Grains o Si 2", *Mat. Res. Soc. Symp. Proc., 355*, pp. 581-586, (1995).

Wang, X.W., et al., "Highly Relaible Silicon Nitride Thin Films Made by Jet Vapor Deposition", *Japanese Journal of Applied Physics, 34*, 955-958, (Feb. 1995).

Winters., H.F., et al., "Influence of Surface Absorption Characteristics on Reactivity Sputtered Films Grown in the Biased Unbiased Modes", *J. Appl. Phys., 43(3)*, pp. 794-799, (1972).

Wolf, S., et al., *Silicon Processing for the VLSI Era, vol. 1 —Process Technology*, Lattice Press, Sunset Beach, CA, p. 514-538, (1986).

Yeh, J.L., et al., "Selective Copper plating of Polysilicon Surface Micromachined Structures", *Solid-State Sensor and Actuator Workshop*, pp. 248-251, (1998).

Zhang, J., et al., "Investigations of photo-induced decomposition of palladium acetate for electroless copper plating", *Thin Solid Films, 318*, pp. 234-238, (1998).

Shacham-Diamand, Y., et al., "Copper electroless deposition technology for ultra-large-scale-intergration (ULSI) metallization", *Microelectronic Engineering, NL*, vol. 33, No. 1, XP004054497, 47-58, (1997).

Stroud, P.T., et al., "Preferential deposition of silver induced by low energy gold ion implantation", *Thin Solid Films, Switzerland*, vol. 9, No. 2, XP000993098, 273-281, (Feb. 1972).

Eisenbraun, E. T., et al., "Selective and Blanket Low-Temperature Copper CVD for Multilevel Metallization in ULSI", *Conference Proceedings ULSI-VII*, (1992),5 pages.

Fukuda, T., et al., "0.5 -micrometer-Pitch Copper-Dual-Damascene Metallization Using Organic SOG (k=2.9) for 0.18-micrometer CMOS Applications", *IEEE*, (1999),pp. 619-622.

Hirao, S. , et al., "A Novel Copper Reflow Process Using Dual Wetting Layers", *Symposium on VLSI Technology*, Digest of Technical Papers,(1997),57-58.

Kaloyeros, A. E., et al., "Blanket and Selective Copper CVD from Cu(FOD)2 for Multilivel Metallization", *Mat. Res. Soc. Symp. Proc.*, vol. 181,(1990),6 pages.

Klaus, J. W., "Atomic Layer Deposition of Tungsten Nitride Films Using Sequential Surface Reactions", *Journal of the Electrochemical Society*, 147(3),(2000),pp. 1175-1181.

Min, Jae-Sik, et al., "Metal-Organic Atomic-Layer Deposition of Titanium-Silicon-Nitride Films", *Applied Physics Letters*, vol. 75, No. 11,(1999),pp. 1521-1523.

Min, J. , et al., "Metal-organic atomic-layer deposition of titanium-silicon-nitride films", *Applied Physics Letters, 75(11)*, (1999),pp. 1521-1523.

Venkatesan, S. , "A High Performance 1.8V, 0.20 micrometer CMOS Technology with Copper Metallization", *IEEE*, (1997),pp. 769-772.

Murarka, S. P., et al., "Copper Metallization for ULSI and Beyond", *Critical Reviews in Solid State and Materials Sciences, 20(2)*, (1995), 87-124.

\* cited by examiner

MTHODS FOR MAKING
INTEGRATED-CIRCUIT WIRING FROM
COPPER, SILVER, GOLD, AND OTHER
METALS

TECHNICAL FIELD

The present invention concerns methods of semiconductor device or integrated circuit manufacturing, particularly methods of forming interconnects from copper and other metals.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together with aluminum wires to define a specific electric circuit, such as a computer memory. The aluminum wires are typically about one micron thick, or about 100 times thinner than a human hair.

To form the aluminum wires, fabricators sometimes use a dual-damascene metallization technique, which takes its name from the ancient Damascan metalworking art of inlaying metal in grooves or channels to form ornamental patterns. The dual-damascene technique entails covering the components on a wafer with an insulative layer of silicon dioxide, etching small holes in the insulative layer to expose portions of the components underneath, and subsequently etching shallow trenches from hole to hole to define a wiring pattern.

Etching the trenches and holes entails forming a mask, using photolithographic techniques, on the insulative layer. The masks, which typically consists of a material called photoresist, shields some portions of the insulative layer from the etchant and allows the etchant to dissolve away other portions. After etching, fabricators remove the mask to expose the patterned insulative layer. They then blanket the entire insulative layer with a thin sheet of aluminum and polish off the excess, leaving behind aluminum vias, or contact plugs, in the holes and thin aluminum wires in the trenches.

The complexity of some integrated circuits demand several interconnected levels of wiring. Some circuits, such as microprocessors, have five or six interconnected levels, with each level formed by repeating the basic dual-damascene produce. For example, to form a second wiring level, fabricators apply a new insulative layer over the first wiring layer, form another mask on the new layer, etch holes and trenches into the new layer, remove the mask, blanket the new layer with aluminum, before finally polishing off the excess to complete it.

In recent years, researchers have begun using copper instead of aluminum to form integrated-circuit wiring, because copper offers lower electrical resistance and better reliability at smaller dimensions. Fabrication of copper-wired integrated circuits sometimes follows an extension of the dual-damascene method which includes an additional step of lining the holes and trenches of an insulative layer with a copper-diffusion barrier before blanketing the layer with copper and polishing off the excess. (The diffusion barrier is generally necessary because copper atoms readily diffuse through common insulators, such as silicon dioxide, resulting in unreliable or inoperative integrated circuits.) Typically, the copper-diffusion barrier is more than 30 nanometers thick and consists of tantalum, tantalum nitride, tantalum-silicon-nitride, titanium nitride, or tungsten nitride. Filling the barrier-lined holes and trenches with copper generally entails depositing a thin copper seed layer on the copper-diffusion barrier, electroplating copper on the seed layer, and then polishing off the excess.

The present inventors identified at least two problems with using the extended dual-damascene technique for making the copper wiring. The first is that typical copper-diffusion barriers add appreciable resistance to the copper wiring, and thus negate some promised performance advantages. And, the second is that the number of separate procedures or steps necessary to make the copper wiring using the extended technique makes fabrication both costly and time consuming.

Accordingly, there is a need for better ways of making copper wiring for integrated circuits.

SUMMARY OF THE INVENTION

To address these and other needs, the inventors devised unique methods of forming wiring from copper and other desirable metals, some of which allow fabrication of copper wiring with fewer steps and lower electrical resistance than some conventional methods. One exemplary method forms a first mask layer with openings that expose underlying transistor contact regions and then forms on the first mask layer a first metal structure of for example, copper, silver, or gold-based metals, which contacts the transistor contact regions. Next, with the first mask layer still in place, the exemplary method forms a second mask layer with openings that expose portions of the underlying first metal structure and then forms on the second mask structure a second metal structure which contacts exposed portions of the first metal structure.

After formation of these mask layers and metal structures, the exemplary method removes both mask layers in a single removal procedure, leaving a space around and between the metal structures. The first and second metal structures are then coated in a single procedure with a 6–10-nanometer-thick diffusion barrier, such as $WSi_xN_y$ (tungsten-silicon-nitrogen.) And subsequently, the space is filled, in another single procedure, with one or more insulative materials, such as silicon dioxide, an aerogel, or an xerogel.

DESCRIPTION OF THE PREFERRED EMBODIMENTS

The following detailed description, which references and incorporates FIGS. 1–8, describes and illustrates specific embodiments of the invention. These embodiments, offered not to limit but only to exemplify and teach the concepts of the invention, are shown and described in sufficient detail to enable those skilled in the art to implement or practice the invention. Thus, where appropriate to avoid obscuring the invention, the description may omit certain information known to those of skill in the art.

Figure 1:
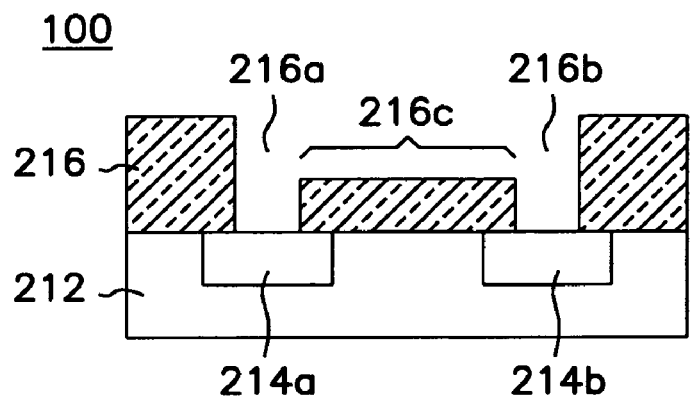
FIG. 1 is a cross-sectional view of an exemplary integrated-circuit assembly 100, including two transistors 214*a* and 214*b* and a mask layer 216 with via holes 216*a* and 216*b*, and a trench 216*c*.

FIGS. 1–7 show a number of cross-sectional views of a partial integrated-circuits assembly 100, which taken collectively and sequentially, illustrate a unique exemplary method of making integrated circuits, and more particularly making integrated-circuit wiring in accord with teachings of the present invention. The method, as shown in FIG. 1, begins with a known integrated-circuit assembly or structure 100, which can exist within any integrated circuit, a dynamic-random-access memory, for example. Assembly 100 includes a substrate 212. The term "substrate," as used herein, encompasses a semiconductor wafer as well as structures having one or more insulative, conductive, or semiconductive layers and materials. Thus, for example, the term embraces silicon-on-insulator, silicon-on-sapphire, and other advanced structures.

Substrate 212 supports a number of integrated elements 214, for example transistors 214a and 214b. Transistors 214a and 214b are covered by a mask layer 216, which, for example, comprises photoresist. In the exemplary embodiment, the transistors are metal-oxide-semiconductor field-effect transistors (MOSFETs); however, in other embodiments, the transistors are other types of field-effect transistors or bipolar junction transistors, or mixed transistor types. Still other embodiments use other types of integrated devices.

Layer 216 includes two exemplary via holes 216a and 216b positioned over respective contact regions (not shown) of transistors 214a and 214b and a trench 216c connecting the via holes. The exemplary embodiment forms layer 216 from photoresist, through use of spincoating, lithography, and photoresist remover. Some embodiments use plasma ashing to pattern the photoresist. Also, in the exemplary embodiment, via holes 216a and 216b are cylindrical with diameters of about 1000 nanometers and depths of about 500 nanometers. Trench 216c is less than 0.50 microns wide and at least one micron deep. The invention, however, is not limited to any particular mask material, formation technique, geometry, or dimensions.

Figure 2:
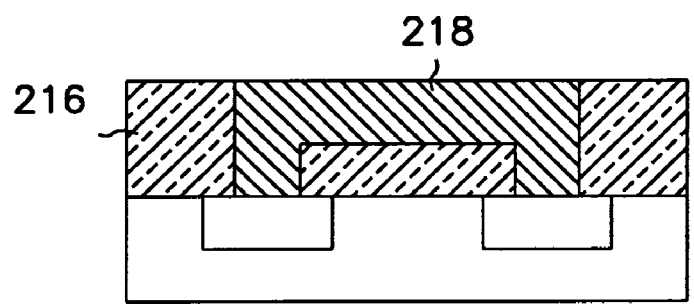
FIG. 2 is a cross-sectional view of the FIG. 1 assembly after formation of conductive structure 218 within holes 216*a* and 216*b* and trench 216*c*.

FIG. 2 shows that the exemplary method next forms a conductive structure 218 on mask 216, with one or more portions of the conductive structure contacting one or more exposed portions of the transistors. In the exemplary embodiment, this entails depositing a 20–30-nanometer-thick copper-, silver-, or gold-based seed layer (not shown separately) using a chemical-vapor-deposition, ionized-magnetron sputtering technique, or DC magnetron self-sputtering technique, and then electroplating additional copper-, silver-, or gold-based material on the seed layer to a total thickness of, for example, 0.5 microns. (As used herein, a copper-, silver-, or gold-based material includes at least 25 weight-percent of the base material.) An exemplary chemical-vapor-deposition technique follows a procedure such as that described in Y. Senzaki, "Chemical Vapor Deposition of Copper Using a New Liquid Precursor with Improved Thermal Stability," MRS Conference Proceedings of Advanced Metallization and Interconnect Systems for ULSI Applications in 1997, ULSI XIII, P. 451–455, 1998, which is incorporated herein by reference. This procedure yields copper films at a typical deposition rate of 150–170 nanometers per minute at wafer temperatures of 195–225° C. The resistance of these films is in the range of 2.0 micro-ohm-centimeter after annealing at 400° C. for five minutes.

Exemplary ionized sputtering technique and d-c magnetron sputtering techniques follow procedures similar to those outlined in S. M. Rossnagel et al., Metal Ion Deposition from Ionized Magnetron Sputtering Discharge," J. Vac. Sci. Technology B, 12(1), p. 449–453, 1994. And Z. J. Radzimski et al, "Directional Copper Deposition using D-C Magnetron Self-sputtering," J. Vac. Sci Technology B 16(3), p. 1102–1106, 1998. Exemplary conditions for the ionized-magnetron sputtering operation are: target power range of 10–30 kilowatts for a 200–300 millimeter diameter wafer (or integrated-circuit assembly), RF coil power at 3–5 kilowatts, negative DC bias of 100–200 volts, sputtering argon gas pressurized at 1–35 millitorrs. Ionized-magnetron sputtering, which provides greater acceleration of the metal deposition material than conventional sputtering, forces the sputtered material to more closely conform to the interior profiles of holes and trenches of the targeted surface.

Notably, the exemplary embodiment omits formation of an adhesion layer to promote adhesion of copper (or other materials) to the mask layer. Some embodiments use a 20–50 nanometer-thick layer of titanium nitride (TiN) over the transistor contacts as an adhesion layer and a diffusion barrier. However, other embodiments provide an adhesion layer of titanium nitride. After depositing the conductive material, the exemplary method removes excess material, for example, using a chemical-mechanical planarization or polishing procedure.

Figure 3:
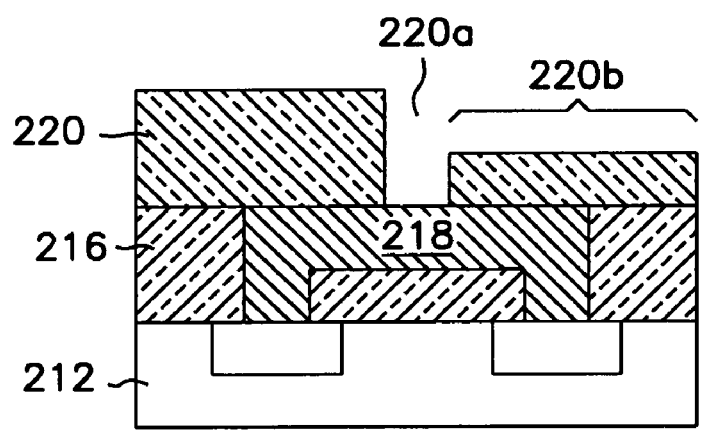
FIG. 3 is a cross-sectional view of the FIG. 2 integrated-circuit assembly after formation of a mask layer 220 on conductive structure 218.

Next, as FIG. 3 shows, the exemplary method forms a mask layer 220 over conductive structure 218. Mask layer 220 includes an opening (via) 220a which exposes a portion of conductive structure 218 and a trench 220b which intersects opening 220a. Exemplary formation of conductive structure follows a procedure similar to that used to form mask layer 216 and occurs with at least a portion of mask layer 216 still in place.

Figure 4:
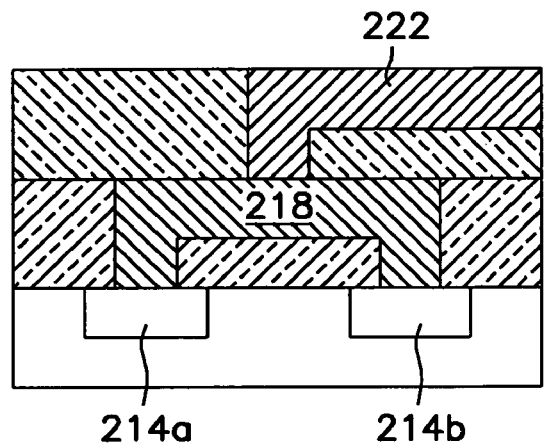
FIG. 4 is a cross-sectional view of the FIG. 3 assembly after formation of a conductive structure 222 on mask layer 220.

FIG. 4 shows that the exemplary method next forms a conductive structure 222 on mask 216, with portions of structure 222 contacting exposed portions of conductive structure 218. In the exemplary embodiment, this entails depositing a 20–30-nanometer-thick copper-, silver-, or gold-based seed layer and electroplating additional copper-, silver-, or gold-based material to an exemplary thickness of 0.5 microns. Excess material is then removed using a chemical-mechanical planarization or polishing procedure. Subsequently, one or more higher-level conductive structures can be formed similarly.

Figure 5:
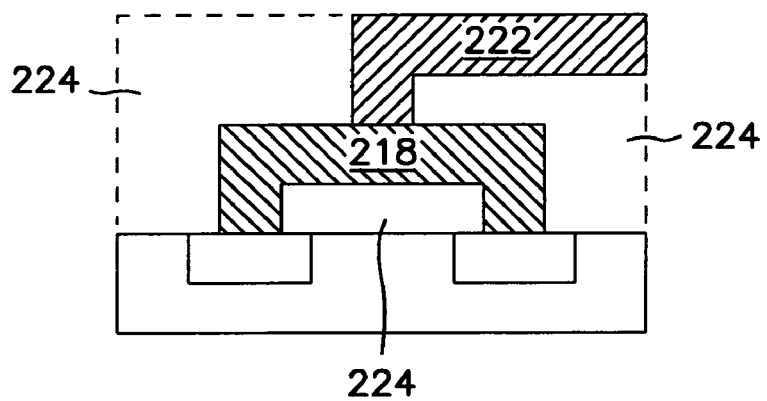
FIG. 5 is a cross-sectional view of the FIG. 4 assembly after removal of mask layers 116 and 220 to define space 224.
Figure 6:
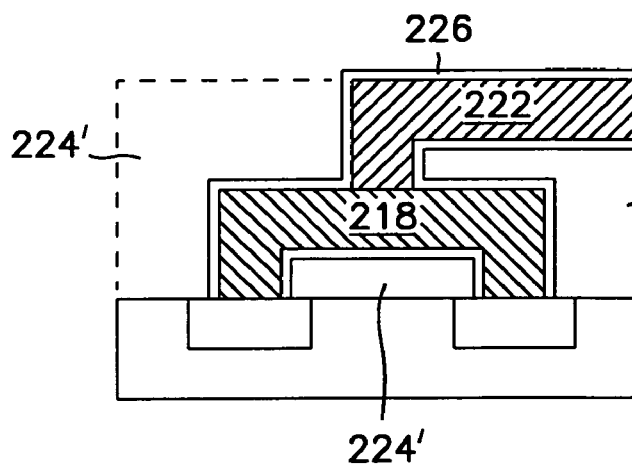
FIG. 6 is a cross-sectional view of the FIG. 5 assembly after forming a diffusion-barrier 226 on conductive structures 218 and 222.

FIG. 5 shows that after forming conductive structure 222, the method removes at least a portion of mask structures 216 and 220, defining one or more spaces or voids 224 around conductive structures 218 and 222. Without the surrounding masks, conductive structures 218 and 222 appears as a two-level airbridge. The exemplary embodiment removes substantially all of the mask structures by ashing them in an oxygen plasma.

After removal of the mask structures, the exemplary method forms a diffusion barrier 226 on at least portions of conductive structures 218 and 222. In the exemplary embodiment, this entails growing or depositing a two-to-six nanometer-thick layer of WSiN over substantially all of conductive structures 218 and 222. Exemplary formation of this layer of WSiN occurs within a hybrid reaction chamber such as that described in co-filed and co-assigned patent application entitled Methods and Apparatus for Making Copper Wiring in Integrated Circuits. This application Ser. No. 09/488,098, is incorporated herein by reference.

More particularly, exemplary formation of diffusion barrier 226 entails forming a graded composition of tungsten silicide ($WSi_x$), with x varying from 2.0 to 2.5. This entails heating the assembly to a temperature of 360° C. and introducing hydrogen, tungsten hexafluoride, and silane gases into a process chamber enclosing the assembly. The exemplary embodiment introduces the hydrogen and tungsten hexaflouride gases about one-to-three seconds before introducing the silane gas and stops introducing the silane gas about one-to-three seconds before stopping introduction of the hydrogen and tungsten hexaflouride. Exemplary flow rates for the silane and tungsten hexaflouride gases are respectively 1000 sccm and 14 sccm. These flow rates result in a composition of $WSi_{2.3}$, with a growth rate of approximately 50 nanometers per minute.

To complete the diffusion barrier, the exemplary method nitrides the graded composition of $WSi_x$, forming $WSi_xN_y$. The exemplary nitridation follows an electron-cyclotron-resonance (ECR) plasma nitridation procedure. One version of this procedure is described in A. Hirata et al., WSiN Diffusion Barrier Formed by ECR Plasma Nitridation for Copper Damascene Interconnection, Extended Abstracts of 1998 International Conference on Solid State Devices and Materials, p. 260–261, which is incorporated herein by reference. This entails introducing nitrogen gas and argon gas into the chamber, with the argon gas exciting a plasma. In the exemplary embodiment, the $WSi_xN_y$ is not a compound-forming barrier, but a stuffed barrier, which prevents diffusion by stuffing nitrogen atoms into diffusion paths, such as interstitial sites, within the tungsten silicide. Other embodiments uses diffusion barriers having different compositions and thicknesses, and some entirely omit a diffusion barrier.

Figure 7:
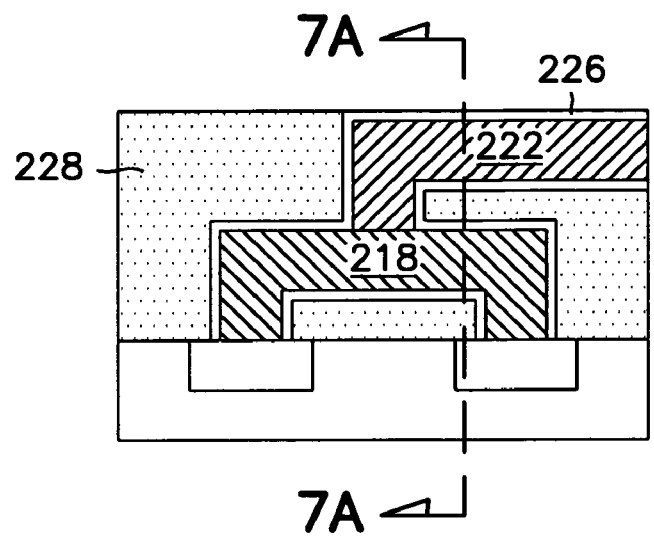
FIG. 7 is a cross-sectional view of the FIG. 6 assembly after filling space 224 with one or more insulative materials to form a two-level insulative structure 228.
Figure 7A:
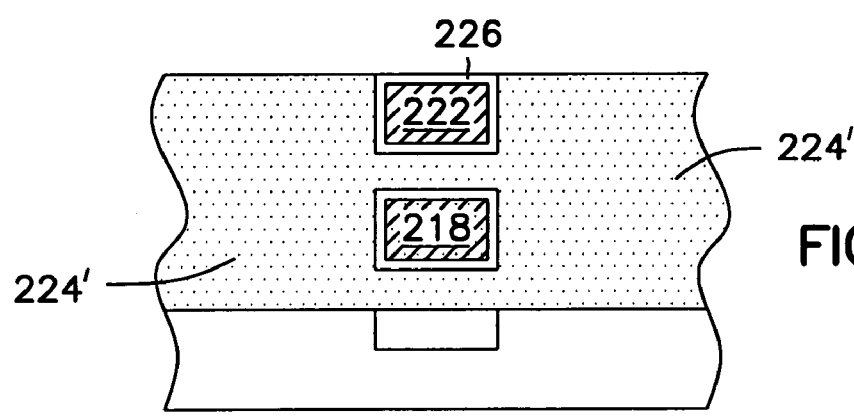

FIG. 7 shows that after completion of diffusion barrier 226, the exemplary method fills at least a portion of the remainder of space 224 (denoted 224' in FIG. 6) with one or more insulative materials to form a two-level insulative structure 228. The exemplary embodiment fills substantially all of space 224, which was previously occupied by mask structures 216 and 220, with a single dielectric material using a single procedure. More particularly, the exemplary embodiment vapor deposits a silicon oxide, such as $SiO_2$, or low-k (that is, low-dielectric-constant) materials, such as xerogels or aerogels. Various methods, such as physical-vapor deposition, chemical-vapor deposition, spin-coating, sol-gel procedures, and so forth can be used to apply these dielectrics.

Figure 8:
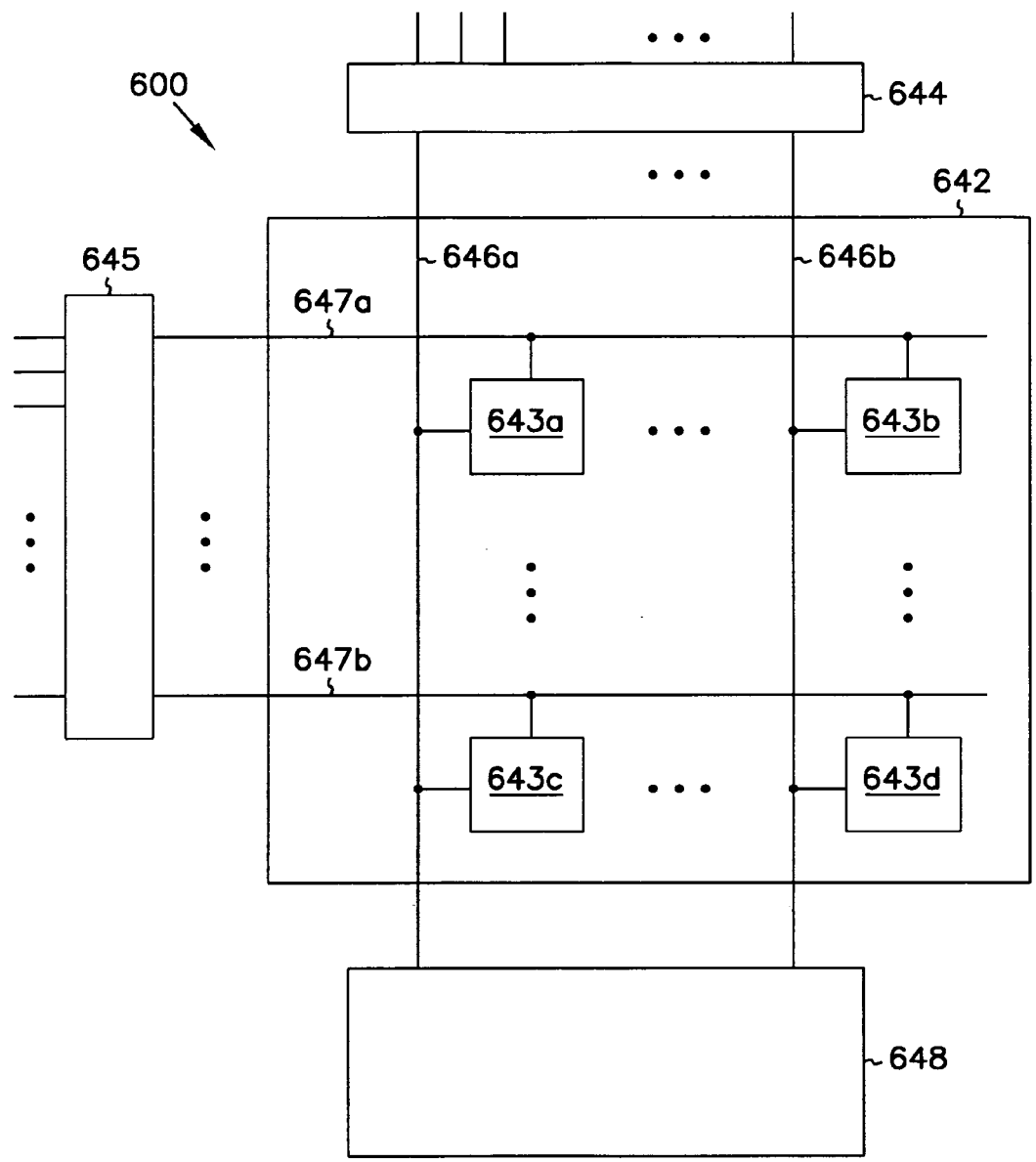
FIG. 8 is a block diagram of an exemplary integrated memory circuit which incorporates the present invention.

FIG. 8 shows one example of the unlimited number of applications for one or more embodiments of the present invention: a generic integrated memory circuit 600. Circuit 600, which operates according to well-known and understood principles, is generally coupled to a processor (not shown) to form a computer system. More precisely, circuit 600 includes a memory array 642 which comprises a number of memory cells 643a–643d, a column address decoder 644, and a row address decoder 645, bit lines 646, word lines 647, and voltage-sense-amplifier circuit 648 coupled to bit lines 646.

In the exemplary embodiment, each of the memory cells, the address decoders, and the amplifier circuit includes one or more copper-, silver-, or gold-based conductors according to the present invention. Other embodiments, use conductors of other materials, made in accord with one or more methods of the present invention. In addition, connections between the address decoders, the memory array, the amplifier circuit are implemented using similar interconnects.

CONCLUSION

In furtherance of the art, the inventors have one or more exemplary methods for making integrated-circuit wiring from materials, such as copper-, silver-, and gold-based metals, some of which allow fabrication of wiring with fewer steps and lower electrical resistance than some conventional methods. One exemplary method initially forms a first mask and a first metal structure on the first mask and then forms a second mask and a second metal structure on the second mask, with the first mask and first metal structure still in place. Continuing, this exemplary method removes both masks in a single removal procedure, forms a diffusion barrier to both metal structures in a single formation procedure, and fills insulative material in and around both metal structures in a single fill procedure. Applying one or more procedures across multiple wiring levels, as in this embodiment, ultimately precludes the necessity of applying these procedures separately to each wiring level and thus promises to simplify fabrication.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:

1. A method comprising:
   forming a conductive plug in contact with an integrated circuit substrate and vertically extending from the substrate;
   forming a horizontally extending conductive line in contact with the conductive plug, wherein the conductive line has a lower surface facing the substrate and vertically spaced apart from the substrate;
   exposing a lateral surface of the conductive plug and the lower surface of the conductive line; and
   forming a single diffusion barrier after forming the conductive plug and the conductive line, with at least a first portion of the diffusion barrier between the lower surface of the conductive line and the substrate.

2. The method of claim 1 wherein the conductive plug and the conductive line comprise a copper-, silver-, or gold-based material.

3. The method of claim 1 further comprises forming an insulative structure after forming the single diffusion barrier by spin-coating an aerogel or xerogel.

4. The method of claim 1 wherein forming the diffusion barrier comprises forming a graded composition of WSix, where x varies from 2.0 to 2.5.

5. The method of claim 1 wherein forming the diffusion barrier comprises:
   forming a graded composition of WSix, where x varies from 2.0 to 2.5; and
   nitriding the graded composition of WSix.

6. The method of claim 1 wherein forming the diffusion barrier comprises:
   introducing tungsten hexaflouride and hydrogen gases into a processing chamber;
   introducing silane gas into the chamber after introducing the tungsten hexaflouride gas; and
   terminating introduction of the silane gas before terminating introduction of the tungsten hexaflouride and hydrogen gases into the chamber.

7. The method of claim 1 wherein forming the conductive plug and the conductive line comprises:
   forming a mask layer on the substrate with contact plug holes that open to the integrated circuit substrate, and trenches intersecting at least some of the contact plug holes;
   depositing a seed layer over the mask layer;
   electroplating conductive material over the seed layer to form the conductive plugs;
   removing excess material to form the conductive line; and
   removing at least a portion of the mask layer to form a opening between the conductive line and substrate to expose the lower surface of the conductive line.

8. The method of claim 7 further comprising:
   forming an adhesion layer over the mask layer before electroplating.

9. The method of claim 1 wherein forming the diffusion barrier comprises:
   forming a layer of tungsten silicon nitrogen over substantially all of exposed surfaces of the conductive plug and conductive line.

10. A method comprising:
    forming a mask layer on an integrated circuit substrate with vertically extending contact plug hole to expose an active region of the substrate;
    depositing a conductor seed layer over the mask layer;
    electroplating conductive material over the seed layer to form a conductive plug in the contact plug hole with a bottom surface in contact with the active area and vertically extending from the substrate;
    forming a horizontally extending conductive line in contact with a top region of the conductive plug, wherein the conductive line has a bottom surface facing a top of the substrate, the conductive line is vertically spaced apart from the substrate by the mask layer;
    removing at least a portion of the mask layer to expose lateral wall surfaces of the conductive plug and the lower surface of the conductive line; and
    forming a single diffusion barrier on exposed surfaces of the conductive plug and the conductive line after removing the mask layer.

11. The method of claim 10 wherein the conductive plug and the conductive line comprise a copper-, silver-, or gold-based material.

* * * * *

UNITED STATES PATENT AND TRADEMARK OFFICE
CERTIFICATE OF CORRECTION

PATENT NO. : 7,262,130 B1  Page 1 of 1
APPLICATION NO. : 09/484303
DATED : August 28, 2007
INVENTOR(S) : Ahn et al.

It is certified that error appears in the above-identified patent and that said Letters Patent is hereby corrected as shown below:

Column 7, line 8, in Claim 6, delete "hexaflouride" and insert -- hexafluoride --, therefor.

Column 7, line 11, in Claim 6, delete "hexaflouride" and insert -- hexafluoride --, therefor.

Column 7, line 13, in Claim 6, delete "hexaflouride" and insert -- hexafluoride --, therefor.

Signed and Sealed this

Eighth Day of January, 2008

JON W. DUDAS
*Director of the United States Patent and Trademark Office*